United States Patent [19]
Pigott et al.

[11] Patent Number: 4,926,073
[45] Date of Patent: May 15, 1990

[54] NEGATIVE VOLTAGE CLAMP

[75] Inventors: John M. Pigott, Phoeniz; Robert B. Jarrett, Tempe, both of Ariz.

[73] Assignee: Motorola Inc., Schaumburg, Ill.

[21] Appl. No.: 345,321

[22] Filed: May 1, 1989

[51] Int. Cl.$^5$ .............................................. H03K 5/08
[52] U.S. Cl. ................................ 307/544; 307/296.4; 307/560; 307/564
[58] Field of Search ............... 307/442, 443, 542, 544, 307/560, 564, 296.4

[56] References Cited

U.S. PATENT DOCUMENTS

| | | | |
|---|---|---|---|
| 3,898,482 | 8/1975 | Holt, Jr. ............................ | 307/542 |
| 4,027,177 | 5/1977 | Davis ................................ | 307/544 |
| 4,345,171 | 8/1982 | Harris, Jr. .......................... | 307/544 |

Primary Examiner—John Zazworsky
Attorney, Agent, or Firm—Michael D. Bingham

[57] ABSTRACT

A negative voltage clamp circuit is coupled to an N-epi region within an IC for clamping the voltage applied thereto to a predetermined negative value without utilizing a negative power supply. A current supply provides a first current through a series combination diode and resistor such that a voltage is developed across the resistor. The base of a first transistor receives drive current from the current supply for providing a second current flowing through its collector-emitter conduction path. The first and second currents respectively flow through the collector-emitter conduction paths of second and third transistors which are configured as a cross-coupled pair. The base-emitter junction of the third transistor is responsive to an applied voltage for gating an appropriate magnitude of the second current to the output for limiting the applied voltage to a predetermined value approximately equal to the voltage developed across the resistor.

12 Claims, 1 Drawing Sheet

NEGATIVE VOLTAGE CLAMP

BACKGROUND OF THE INVENTION

The present invention relates in general to the protection of integrated circuits (IC) and, more particularly, to a voltage clamp circuit having an output for clamping the voltage applied thereto to a predetermined value. The need for protection of vulnerable areas within an IC from an undesirable voltage is well known and applicable to most if not all bipolar technologies. In standard bipolar processes for example, junction diodes are formed between adjacent P-substrate and N-epitaxial (N-epi) regions. N-epi regions are commonly coupled to the IC pins rendering the junction vulnerable to a negative voltage. Should an unknown negative voltage of sufficient magnitude be applied to the IC pin, the P-substrate/N-epi junction diode (N-epi diode) would become forward biased thereby injecting electrons into the P-substrate which could seriously degrade, or even destroy the IC.

A typical method to protect the IC is to couple the output of a voltage clamp circuit to the vulnerable N-epi regions at the particular IC pin. The voltage clamp circuit is then responsive to the output signal of an external voltage supply having a finite output impedance for limiting the voltage applied to the IC pin to a predetermined value which is less than the cutin potential of the N-epi diode. When the external voltage supply attempts to assert a negative voltage, the voltage clamp circuit then sources a current which develops a potential across the output impedance of the voltage supply thereby limiting the voltage applied to the IC pin.

A known voltage clamp circuit may be realized with an NPN transistor having an emitter coupled to the vulnerable N-epi region, and a base coupled to the anode of a diode. A voltage, typically ground potential, is applied to the cathode of the diode. The collector and base of the NPN transistor are coupled to the input and utput of a PNP current mirror circuit respectively forming a feedback loop from the collector to the base of the NPN transistor. Ideally, the NPN transistor turns on when the magnitude of the voltage applied to its emitter passes through ground potential in the negative direction. The voltage clamp circuit then sources a current of appropriate magnitude to the external voltage supply which is coupled to the emitter of the NPN transistor to limit the applied voltage to approximately ground potential thereby protecting the N-epi region as described above.

It is not uncommon during normal operation for the magnitude of the externally applied voltage to be equal to ground potential, thus it would be undesirable to turn on the voltage clamp circuit and source current to the external voltage supply under this condition. Although the aforedescribed voltage clamp circuit can achieve a below ground clamping threshold by applying a negative voltage to the cathode of the diode, such negative power supplies are not readily available in many circumstances including automotive applications. Another problem with the known voltage clamp circuit is the inherent slow transient response of the PNP current mirror feedback loop. Should the slew rate of the external voltage supply exceed the loop response time of the PNP current mirror, the reaction of the NPN transistor would lag the external voltage supply which could allow the voltage applied to the N-epi region to exceed the cutin potential thereby forward biasing the N-epi diode and injecting electrons into the P-substrate.

Hence, there is a need for an improved voltage clamp circuit for clamping the voltage applied to a N-epi region to predetermined negative value without utilizing a negative power supply. Also, the transient loop response time of the improved voltage clamp circuit must be less than the estimated maximum slew rate of the external voltage supply.

SUMMARY OF THE INVENTION

It is therefore an objective of the present invention to provide an improved voltage clamp circuit.

A further objective of the present invention is to provide an improved negative voltage clamp circuit for coupling to a vulnerable area such as an N-epi region within an IC for clamping the voltage applied thereto to a predetermined negative value without utilizing a negative power supply.

Another objective is to provide a negative voltage clamp circuit having a transient loop response time less than the estimated maximum slew rate of the external voltage supply.

In accordance with the above and other objectives there is provided a voltage clamp circuit comprising a current supply for sourcing a first current; a first transistor having a base coupled to the utput of the current supply for providing a second current flowing through the collector-emitter conduction path thereof; a diode and a resistor in series for receiving the first current which develops a voltage across the resistor; and a circuit having first and second inputs for receiving the first and second currents respectively and an output which is coupled to the output of the voltage clamp circuit wherein the circuit provides the appropriate magnitude of the second current to the output in response to a voltage applied thereto for clamping the applied voltage to a predetermined value approximately equal to the voltage developed across the resistor.

DETAILED DESRIPTION OF THE PREFERRED EMBODIMENT

Known current supply circuit 10 is disclosed because it utilizes a structure having similarities to the circuit of the present invention. However, the structure of current supply circuit 10 cannot satisfy the objectives of the present application.

Figure 1:
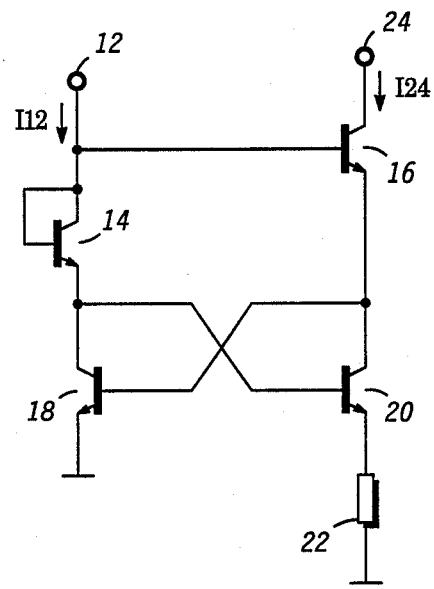
FIG. 1 is a schematic diagram illustrating a known current supply circuit having a similar structure.

With reference to FIG. 1, current supply circuit 10 receives current I12 through input 12 for biasing diode 14 which is coupled between the base of transistor 16 and the collector of transistor 18. As shown, cross-coupled transistors 18 and 20 have their bases coupled to the opposite collectors and their emitters coupled to a power supply conductor and resistor 22 respectively. The collector-emitter conduction path of transistor 16 is coupled between output 24 and the collector of transistor 20 for providing output current I24.

Assuming ideal transistors having negligible base currents and equal emitter areas, current supply circuit 10 comprises a first current path through diode 14 and transistor 18, and a second current path through transistors 16 and 20. The base-emitter voltage ($V_{be}$) of transistor 18 is equal to the potential developed across diode 14 since current I12 flows through both devices. Likewise, the $V_{be}$'s of transistors 16 and 20 are also equal as they both conduct current I24. However, the emitter area of transistor 20 is typically N times the emitter area of the other loop transistors where N is a positive value greater than or equal to one. Thus, the $V_{be}$ of transistor 20 is actually equal to $V_{20} - V_t^* \ln(N)$ where "$V_t$" is the well known volt equivalent temperature and "ln" is the natural log function. An expression for output current I24 can be obtained from the loop equation as follows:

$$V_{18} + V_{16} - V_{14} - (V_{20} - V_t^* \ln(N)) - I24^*R22 = 0 \quad (1)$$

where:
$V_{14}$ is the potential across diode 14
R22 is the value of resistor 22
$V_{16}$, $V_{18}$ and $V_{20}$ are the $V_{be}$'s of transistors 16, 18 and 20 assuming equal emitter areas respectively
$V_t^* \ln(N)$ is the incremental voltage due to the larger emitter area of transistor 20

Equation (1) may be reduced to:

$$I24 = V_t^* \ln(N)/R22 \quad (2)$$

Thus, known current supply circuit 10 provides constant current I24 which is a function of the ratio of the emitter areas and the value of resistor 22 as described in Equation (2). Using the basic cross-coupled transistor structure of current supply circuit 10, and making certain structural changes which are necessary to achieve the desired objectives, we can realize a voltage clamp circuit as described hereafter. As will be shown, the addition of a resistor and current supply provides a means to bias the output to a predetermined below ground value subject to the operational characteristics of the voltage clamp circuit.

Figure 2:
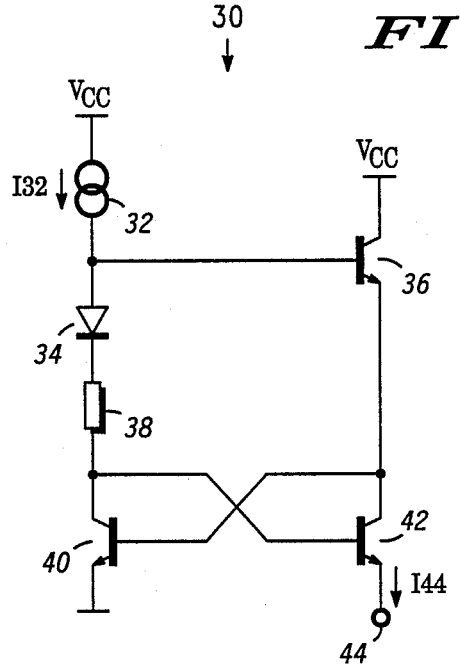
FIG. 2 is a schematic diagram illustrating the preferred embodiment of the present invention.

Turning to FIG. 2, voltage clamp circuit 30 includes current supply 32 which is coupled to a positive power supply voltage, typically $V_{CC}$, for sourcing current I32 to the anode of diode 34 as well as supply base current drive to the base of transistor 36. A voltage, typically $V_{CC}$, is applied to the collector of transistor 36. The cathode of diode 34 is coupled to the collector of transistor 40 via resistor 38. As understood, diode 14 may be realized with a transistor having its base and collector coupled together. The collectors and bases of transistors 40 and 42 are respectively cross-coupled to resistor 38 and to the emitter of transistor 36 as shown. A voltage, typically ground potential, is applied to the emitter of transistor 40. The emitter of transistor 42 is coupled to output 44 for providing output current I44. Typically, voltage clamp circuit 30 is formed within an IC using conventional integrated circuit processes such that output 44 is coupled to a vulnerable N-epi region within the IC. To insure proper operation of the IC, voltage clamp circuit 30 should impose negligible loading effects during normal operation, i.e., a positive voltage appearing at output 44, and yet, in the event that an external voltage supply should attempt to assert a significant negative voltage, quickly respond with ample source current I44 to limit the applied voltage to a value less than the cutin voltage of the N-epi diode.

The operation of voltage clamp circuit 30 is first considered with ideal transistors having negligible base currents and equal emitter areas. A positive external voltage ($V_{44}$) is applied to output 44. Current supply 32 provides current I32 which flows through diode 34, resistor 38 and the collector-emitter conduction path of transistor 40. Since their currents are identical, the voltage developed across diode 34 must be equal to the $V_{be}$ of transistor 40 from the well known diode equation. The voltage at the output of current supply 32 biases transistor 36 rendering it conductive thereby providing drive current to the base of transistor 40. The voltage at the base of transistor 36 is then equal to the sum of the voltages $V_{36}$ and $V_{40}$ which are the $V_{be}$'s of transistors 36 and 40 respectively. The voltage at the base of transistor 42 ($V_{42base}$) with respect to ground potential is equal to the voltage at base of transistor 36 ($V_{40} + V_{36}$) less the potential across diode 34 ($V_{34}$) and the voltage across resistor 38 ($I32^*R38$) which may also be expressed as:

$$V_{42base} = V_{40} + V_{36} - V_{34} - (I32^*R38) \quad (3)$$

The $V_{be}$ of transistor 42 ($V_{42}$) may then be expressed as the potential difference between the voltage $V_{42base}$ and $V_{44}$. Combining expressions and recalling that the voltage $V_{40}$ is substantially equal to the voltage $V_{34}$:

$$V_{44} = V_{36} - (I32^*R38) - V_{42} \quad (4)$$

Since $V_{44}$ is a positive voltage, it follows that $V_{42}$ must be less than $V_{36}$ hence transistor 42 is turned off. Therefore, the base-emitter junction of transistor 42 is unbiased which produces a high impedance state essentially isolating voltage clamp circuit 30 from the remaining circuitry of the IC. Also, note that transistor 42 remains turned off until the voltage $V_{44}$ is equal to minus $I32^*R38$.

Now assume that voltage $V_{44}$ is reduced through zero potential to a value equal to minus $I32^*R38$. Transistor 42 begins to conduct which reduces the voltage at the collector of transistor 42 thereby turning transistor 36 on harder. The collector-emitter conduction path of transistor 42 provides the appropriate magnitude of current I44 through output 44 which in turn develops a potential across the output impedance of the external voltage supply such that the voltage applied to output 44 is equal to a predetermined clamp threshold. The loop equation around voltage clamp circuit 30 may be written as follows:

$$V_{44} + V_{42} + I32^*R38 + V_{34} - V_{36} - V_{40} = 0 \quad (5)$$

Now that transistor 42 is conducting current I44 flows through both transistors 36 and 42. Hence, the voltages $V_{42}$ and $V_{36}$ are substantially equal and equation (5) can be reduced to:

$$V_{44} = -I32^*R38 \quad (6)$$

This is a key relationship for the present invention as the clamping voltage is defined as the negative product of current I32 and resistor 38 independent of the voltage across diode 34 and the $V_{be}$'s of the loop transistors 36, 40 and 42. Voltage clamp circuit 30, without using a negative power supply, has limited the voltage applied to the N-epi regio within the IC to a negative value equal to the voltage across resistor 38. In addition, voltage clamp circuit 30 utilizes an all NPN structure for providing a loop transient response time typically an order of magnitude faster than the estimated maximum slew rate of an external voltage supply which is typically in the microsecond range.

A variation of voltage clamp circuit 30 includes dissimilar emitter areas in the loop transistors. Note that diode 34 may be realized as NPN transistor 34 having its base connected to its collector. Writing the loop equation in terms of the unequal emitter areas:

$$V_{44}+[V_{42}-V_t^* \ln(A_{42})]+I_{32}^*R_{38}+[V_{34}-V_t^* \ln(A_{34})]-[V_{36}-V_t^* \ln(A_{36})]-[V_{40}-V_t^* \ln(A_{40})]=0 \quad (7)$$

$$V_{44}+I_{32}^*R_{38}+[V_{42}-V_{36}-V_t^* \ln(A_{42})+V_t^* \ln(A_{36})]+[V_{34}-V_{40}-V_t^* \ln(A_{34})+V_t^* \ln(A_{40})]=0$$

$$V_{44}+I_{32}^*R_{38}-V_t^* \ln(A_{42}^*A_{34}/A_{36}^*A_{40})=0$$

$$V_{44}=-I_{32}^*R_{38}+[V_t^* \ln(A_{42}^*A_{34}/A_{36}^*A_{40})] \quad (8)$$

where:

$A_{42}$, $A_{34}$, $A_{36}$ and $A_{40}$ are the emitter areas of transistors 42, 34, 36 and 40 respectively As demonstrated in equation (8), the dissimilar emitter areas of the loop transistors have provided a means to to fine tune the clamp threshold.

Hence, what has been described is a novel negative voltage clamp circuit for coupling to an N-epi region within an IC for clamping the voltage applied thereto to a predetermined negative value without utilizing a negative power supply. In addition, the negative voltage clamp circuit has been realized with an all NPN structure for providing a transient loop response time an order of magnitude faster than the typical slew rate of an external voltage supply.

While there have been described above the principles of the invention in conjunction with a specific apparatus, it is clearly understood that this description is made only by way of example and is not a limitation to the scope of the invention.

We claim:

1. A voltage clamp circuit having an output, comprising:
   current supply means for providing a first current of predetermined magnitude;
   a first transistor having a base coupled to said current supply means and a collector-emitter conduction path for providing a second current;
   first circuit means coupled in series to said current supply means including diode means and a resistor such that a voltage is developed across the resistor proportional to said first current; and
   second circuit means having first and second inputs for receiving said first and second current respectively and an output which is coupled to the output of the voltage clamp circuit wherein said circuit means provides the appropriate magnitude of said second current to said output in response to a voltage applied thereto for clamping said applied voltage to a predetermined value approximately equal to said voltage developed across said resistor.

2. The voltage clamp circuit of claim 1 wherein said second circuit means includes:
   a second transistor having a base, an emitter and a collector, said collector of said second transistor being coupled to said first input of said second circuit means, said emitter of said second transistor having a voltage applied thereto; and
   a third transistor having a base, an emitter and a collector, said collector of said third transistor being coupled to said second input of said circuit means and to said base of said second transistor, said base of said third transistor being coupled to said collector of said second transistor, said emitter of said third transistor being coupled to said output of said second circuit means.

3. The voltage clamp circuit of claim 2 wherein the collector of said first transistor is coupled to a terminal which has a voltage applied thereto and the emitter of said first transistor is coupled to said collector of said third transistor.

4. The voltage clamp circuit of claim 3 wherein said diode means includes an anode coupled to said current supply means and a cathode.

5. The voltage clamp circuit of claim 4 wherein said resistor includes first and second terminals, said first terminal being coupled to said cathode of said diode means, said second terminal being coupled to said first input of said second circuit means.

6. The voltage clamp circuit of claim 5 wherein said diode means comprises a fourth transistor having a base, an emitter and a collector, said base being coupled to said current supply means, said collector and said base being coupled together, said emitter being coupled to said first terminal of said resistor.

7. An integrated voltage clamp circuit having an output, comprising:
   current supply means for providing a first current of predetermined magnitude;
   a first transistor having a bae coupled to said current supply means and a collector-emitter conduction path for providing a second current;
   first circuit means coupled in series to said current supply means including diode means and a resistor such that a voltage is developed across the resistor proportional to said first current; and
   second circuit means having first and second inputs for receiving said first and second current respectively and an output which is coupled to the output of the voltage clamp circuit wherein said second circuit means provides the appropriate magnitude of said second current to said output in response to a voltage applied thereto for clamping said applied voltage to a predetermined value approximately equal to said voltage developed across said resistor.

8. The voltage clamp circuit of claim 7 wherein said second circuit means includes:
   a second transistor having a base, an emitter and a collector, said collector of said second transistor being coupled to said first input of said second circuit means, said emitter of said second transistor having a voltage applied thereto; and
   a third transistor having a base, an emitter and a collector, said collector of said third transistor being coupled to said second input of said second circuit means and to said base of said second transistor, said base of said third transistor being coupled to said collector of said second transistor, said emitter of said third transistor being coupled to said output of said second circuit means.

9. The voltage clamp circuit of claim 8 wherein the collector of said first transistor is coupled to a terminal which has a voltage applied thereto and the emitter of said first transistor is coupled to said collector of said third transistor.

10. The voltage clamp circuit of claim 9 wherein said diode means includes an anode coupled to said current supply means and a cathode.

11. The voltage clamp circuit of claim 10 wherein said resistor includes first and second terminals, said first terminal being coupled to said cathode of said diode means, said second terminal being coupled to said first input of said second circuit means.

12. The voltage clamp circuit of claim 11 wherein said diode means comprises a fourth transistor having a base, an emitter and a collector, said base being coupled to said current supply means, said collector and said base being coupled together, said emitter being coupled to said first terminal of said resistor.

* * * * *